US 7,924,038 B2

(12) United States Patent
Kuniyoshi et al.

(10) Patent No.: US 7,924,038 B2
(45) Date of Patent: Apr. 12, 2011

(54) PROBE AND ELECTRICAL CONNECTING APPARATUS USING IT

(75) Inventors: Shinji Kuniyoshi, Tokyo (JP); Yuji Miyagi, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 12/064,620

(22) PCT Filed: Apr. 26, 2007

(86) PCT No.: PCT/JP2007/059424
§ 371 (c)(1),
(2), (4) Date: Feb. 22, 2008

(87) PCT Pub. No.: WO2008/090635
PCT Pub. Date: Jul. 31, 2008

(65) Prior Publication Data
US 2010/0219854 A1 Sep. 2, 2010

(30) Foreign Application Priority Data

Jan. 22, 2007 (JP) .................................. 2007-011279

(51) Int. Cl.
*G01R 31/00* (2006.01)
(52) U.S. Cl. .......... 324/755.01; 324/755.07; 324/750.23
(58) Field of Classification Search .................. None
See application file for complete search history.

(56) References Cited

U.S. PATENT DOCUMENTS

| 6,933,738 B2 * | 8/2005 | Martin et al. ................. 324/758 |
| 7,449,906 B2 * | 11/2008 | Miura et al. ................. 324/761 |

FOREIGN PATENT DOCUMENTS

| EP | 1624308 A1 | 2/2006 |
| JP | 2001-349929 | 12/2001 |
| JP | 2004-340654 | 12/2004 |
| JP | 2005-533263 | 11/2005 |
| WO | WO 2004/015432 A1 | 2/2004 |
| WO | WO 2004/102207 A1 | 11/2004 |

* cited by examiner

*Primary Examiner* — Minh N Tang
(74) *Attorney, Agent, or Firm* — Ingrassia Fisher & Lorenz, P.C.

(57) ABSTRACT

A probe having an alignment mark that is hardly influenced by scraps of an electrode scraped by a probe tip is provided. A probe according to the present invention comprises a base portion having an attaching end and extending in a direction distanced from the attaching end, an arm portion extending from the base portion laterally with a space in the extending direction of the base portion from the attaching end, a probe tip portion protruded from the arm portion and having a probe tip formed on its protruding end, and an alignment mark for alignment of the probe tip. The arm portion has a flat surface area on the opposite side of a side where the attaching end of the base portion is located when seen along the extending direction of the arm portion. The probe tip portion is formed to be protruded from the flat surface area, and the alignment mark is constituted by at least a part of the flat surface area.

8 Claims, 7 Drawing Sheets

PROBE AND ELECTRICAL CONNECTING APPARATUS USING IT

TECHNICAL FIELD

The present invention relates to a probe suitable for use in an electrical test of a semiconductor device such as a semiconductor integrated circuit and an electrical connecting apparatus in which this probe has been incorporated.

BACKGROUND ART

A plurality of semiconductor devices such as semiconductor integrated circuits formed on respective chip areas on a semiconductor wafer undergo an electrical test to determine whether or not each of them is manufactured in accordance with the specification. In this kind of the electrical test, an electrical connecting apparatus generally called a probe card is used. The probe card is mounted on a tester for the electrical test, and a plurality of probes (contactors) provided on the probe card are thrust against respective corresponding electrodes of a device under test on a stage. The device under test is connected to the tester via this probe card and thus undergoes the electrical test.

The aforementioned probe comprises a base portion protruded from a probe board, an arm portion laterally extending from the base portion along the board, and a pad portion (probe tip portion) protruded to the opposite side of the board from the arm portion, and a probe tip is formed on this pad portion. The pad portion is provided to prevent the interference between the lower surface of the arm portion and the device under test or another electrode disposed thereon and let the probe tip contact an electrode reliably when the probe tip is thrust against the electrode of the device under test. An alignment mark used for alignment between each probe of the probe card and a corresponding electrode of the device under test is formed on this pad portion (for example, refer to Patent Document 1 or 2). From a captured image of this alignment mark, relative positional information between a support table on which the device under test is arranged and the probe card is obtained, and positional adjustment of the probe card is performed based on this positional information.

Patent Document 1: Japanese National Patent Publication No. 2005-533263.
Patent Document 2: Japanese Patent Appln. Public Disclosure No. 2004-340654.

However, the alignment mark provided on the pad portion is provided in the vicinity of the height position of the probe tip. As the alignment mark is formed near the height position of the probe tip, scraps of the electrode attached to the probe tip may be attached to the alignment mark. The scraps of the electrode attached to the alignment mark may make it difficult to determine the image form of the alignment mark accurately. Accordingly, in the conventional electrical connecting apparatus, accurate positional adjustment is sometimes difficult.

DISCLOSURE OF THE INVENTION

Problems to be Solved by the Invention

Accordingly, it is an object of the present invention to provide a probe having an alignment mark that is hardly influenced by scraps of an electrode scraped by a probe tip of the probe and an electrical connecting apparatus in which this probe has been incorporated.

Means to Solve the Problems

A probe according to the present invention comprises a base portion having an attaching end and extending in a direction distanced from the attaching end, an arm portion extending from the base portion laterally with a space in the extending direction of the base portion from the attaching end, a probe tip portion protruded from the arm portion and having a probe tip formed on its protruding end, and an alignment mark for alignment of the probe tip. The arm portion has a flat surface area on the opposite side of a side where the attaching end of the base portion is located when seen along the extending direction of the arm portion, the probe tip portion is formed to be protruded from the flat surface area, and the alignment mark is constituted by at least a part of the flat surface area.

In the probe according to the present invention, the distance from the flat surface area on which the alignment mark is formed to the probe tip corresponds to the sum of the height of the probe tip and the step of the probe tip portion (pad portion) on which the probe tip is formed. Thus, the distance increases as much as the step of the probe tip portion when compared with the conventional case. Due to this increase as much as the step, the scraps of the electrode pad attached to the probe tip hardly attach to the alignment mark.

Also, the probe according to the present invention can be formed relatively easily by forming a recess formed in an outer shape of the probe by a mask utilizing photolithography, for example, and depositing a conductive material for the probe in the recess by utilizing electroplating, for example. At the time of forming this mask, by forming a flat surface part corresponding to the flat surface area at the edge part of the recess forming the flat surface shape of the probe, the probe according to the present invention can be formed easily with no need to perform specific marking processing on the arm portion for formation of the alignment mark.

It is desirable that a normal line of the flat surface area part constituting the alignment mark be directed in the same direction as the protruding direction of the probe tip of the probe tip portion.

It is desirable that the probe tip portion be formed so that no reflective surface to an image capturing apparatus capturing the alignment mark is provided at the probe tip portion excluding the flat surface of the probe tip of the probe tip portion. In such a case, the side surface of the probe tip portion is formed so that the angle between the side surface of the probe tip portion and the flat surface of the probe tip may exceed 20 degrees, for example.

The flat surface area of the arm portion can be constituted by a lower surface of the arm portion. The lower surface can be located on the arm portion on the opposite side of a side where the attaching end of the base portion is located and can be formed in a rectangular flat surface shape extending along the extending direction of the arm portion.

The probe tip portion can be formed on the lower surface to separate the lower surface in the extending direction of the arm portion. In such a case, the alignment mark can be constituted by one of the flat surface area parts into which the lower surface is separated by the probe tip portion.

Also, by forming the probe tip portion to be spaced apart from an extending edge of the arm portion, the alignment mark can be constituted by a flat surface area part formed between the extending edge and the probe tip portion on the lower surface of the arm portion.

The alignment mark can be formed in an approximately square shape.

The probe tip portion can have a side wall proximate to the flat surface area part constituting the alignment mark and standing up from the flat surface area part, and a portion of the side wall proximate to the flat surface area part can be a recessed curved line opened toward the flat surface area part.

The arm portion can be constituted by a pair of arm portions spaced apart from each other in the extending direction of the base portion and extending laterally. In such a case, a lower surface of a lower arm portion located on the side apart from the attaching end of the base portion, out of the pair of arm portions, can form the flat surface area part.

The probes according to the present invention can constitute an electrical connecting apparatus with a probe board by attaching them to the probe board so that they are connected to corresponding wiring paths of the probe board on which the plurality of wiring paths are formed.

Effect of the Invention

According to the present invention, since the scraps of the electrode pad hardly attach to the alignment mark, a bright image of the alignment mark is less frequently prevented from being captured by these scraps. As a result, accurate alignment of the probe tip can be done based on the accurate recognition of the alignment mark image.

BEST MODE TO CARRY OUT THE INVENTION

Figure 1:
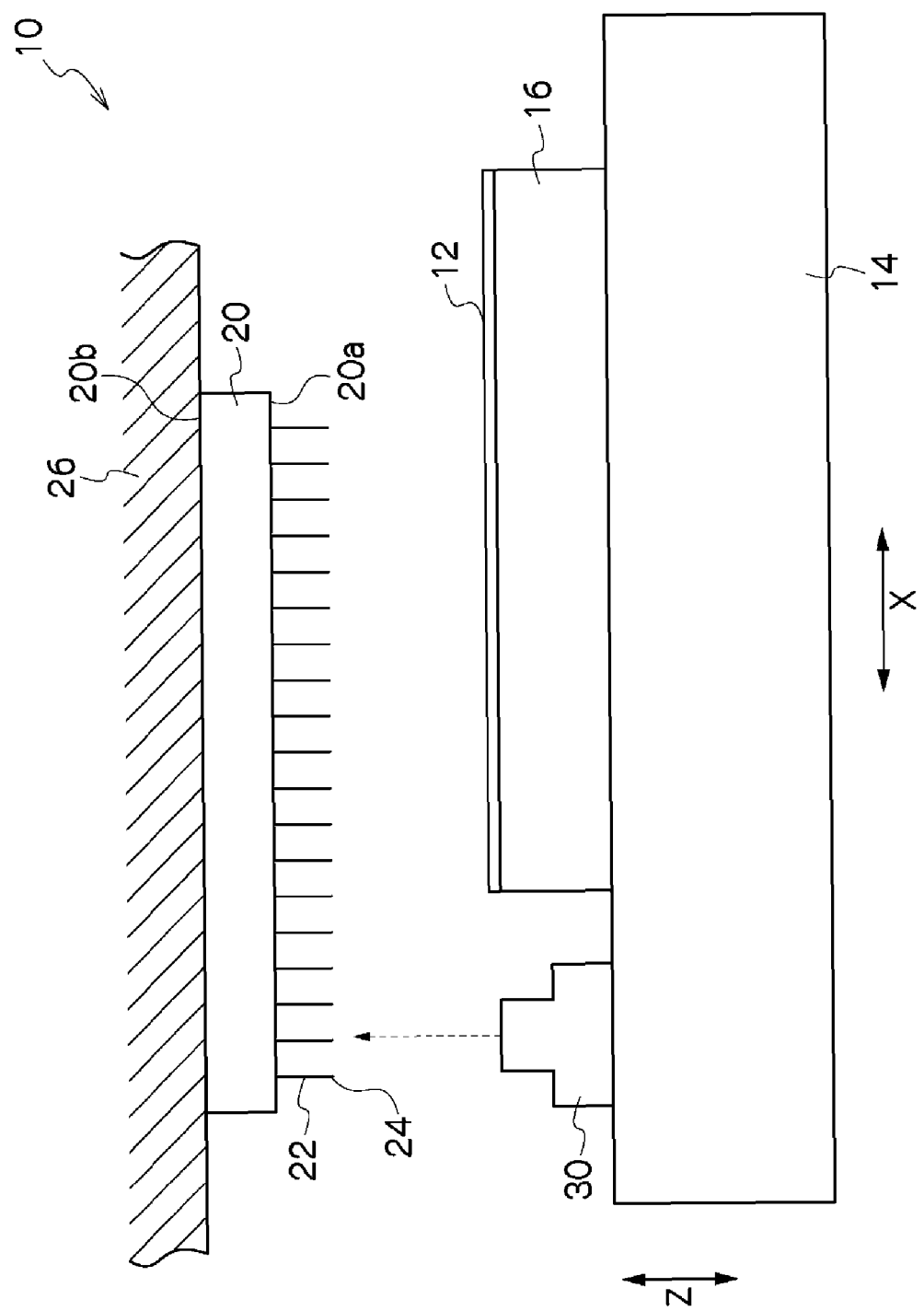
FIG. 1 is a schematic view showing an alignment example of an electrical connecting apparatus according to the present invention.

An electrical connecting apparatus 10 according to the present invention is used for an electrical test of a semiconductor wafer 12 in an example shown in FIG. 1. The semiconductor wafer 12 is removably held on a chuck top 16 provided on an XYZθ stage 14, for example, by suction negative pressure, in the example in the figure. Although not shown in the figure, on the semiconductor wafer 12 are arranged a plurality of IC chip areas in a matrix form, and in each of the IC chip areas is formed an integrated circuit. In order to connect a plurality of electrodes formed in this integrated circuit to a tester main body (not shown) for the electrical test, the electrical connecting apparatus 10 is held by a tester head, not shown, on the upper side of the XYZθ stage 14.

Figure 2:
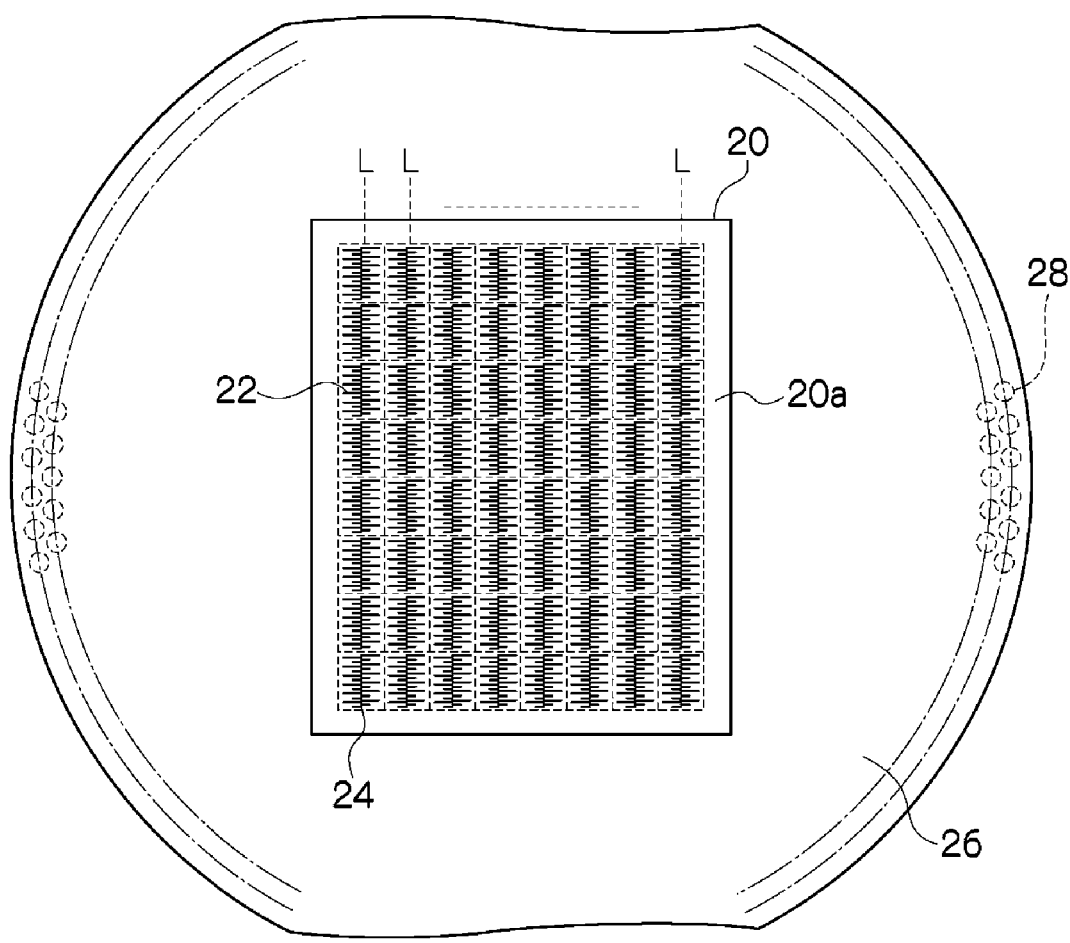
FIG. 2 is a bottom view of the electrical connecting apparatus shown in FIG. 1.

The electrical connecting apparatus 10 comprises a probe board 20 on which a plurality of wiring paths 18 (refer to FIGS. 3 and 4) are provided and a plurality of probes 22 attached to the probe board. The respective probes 22 are arranged on a lower surface 20a of the probe board 20 to align on each straight line (L) so that their probe tips 24 may correspond to the electrodes of the semiconductor wafer 12, as shown in FIG. 2. The probe board 20 is held by the tester head via a circuit board 26 coupled to its upper surface 20b so that the probe tips 24 of the probes 22 provided on its lower surface 20a may be directed downward, and the probe board 20 may be parallel to the chuck top 16 on the XYZθ stage 14, as shown in FIG. 1.

Each probe 22 provided on the probe board 20 is connected to each tester land 28 (refer to FIG. 2) provided on the upper surface 20b of the probe board via the wiring path 18 corresponding to this probe and a conductive path (not shown) provided in the circuit board 26 to correspond to the wiring path, as conventionally well known. Each tester land 28 is connected to the tester main body via a not shown wire as in the conventional case. Thus, each probe 22 is electrically connected to the tester main body via the corresponding tester land 28.

The XYZθ stage 14 can be displaced, for example, in an X axis direction along the lateral direction in FIG. 1, a Y axis direction perpendicular to the X axis and the sheet, and a Z axis direction perpendicular to the X and Y axes and enables rotation θ around the Z axis, as conventionally well known. On this XYZθ stage 14 is provided a capturing apparatus 30 such as a CCD camera that captures an image of the alignment mark provided on the electrical connecting apparatus 10 located above the stage.

When a captured image of the alignment mark provided on the electrical connecting apparatus 10 is obtained through the capturing apparatus 30, relative positional information between the chuck top 16 on which the semiconductor wafer 12 as a device under test is mounted and the electrical connecting apparatus 10 as a probe card is obtained by conventionally well known image processing, and based on this positional information, the XYZθ stage 14 is driven in the directions of X and Y axes and around the Z axis so that the probe tip 24 of each probe 22 can contact the corresponding electrode of the semiconductor wafer 12, and thus a relative position of the electrical connecting apparatus 10 against the semiconductor wafer 12 is adjusted.

After this positional adjustment, the XYZθ stage 14 is driven in the Z axis direction so that the electrode of the semiconductor wafer 12 is connected to the probe tip 24 of the corresponding probe 22. As a result of the electrical connection between the probe tips 24 of the probes 22 and the respective corresponding electrodes, the tester main body is connected to the respective integrated circuits on the semiconductor wafer 12 to conduct a predetermined electrical test.

Figure 3:
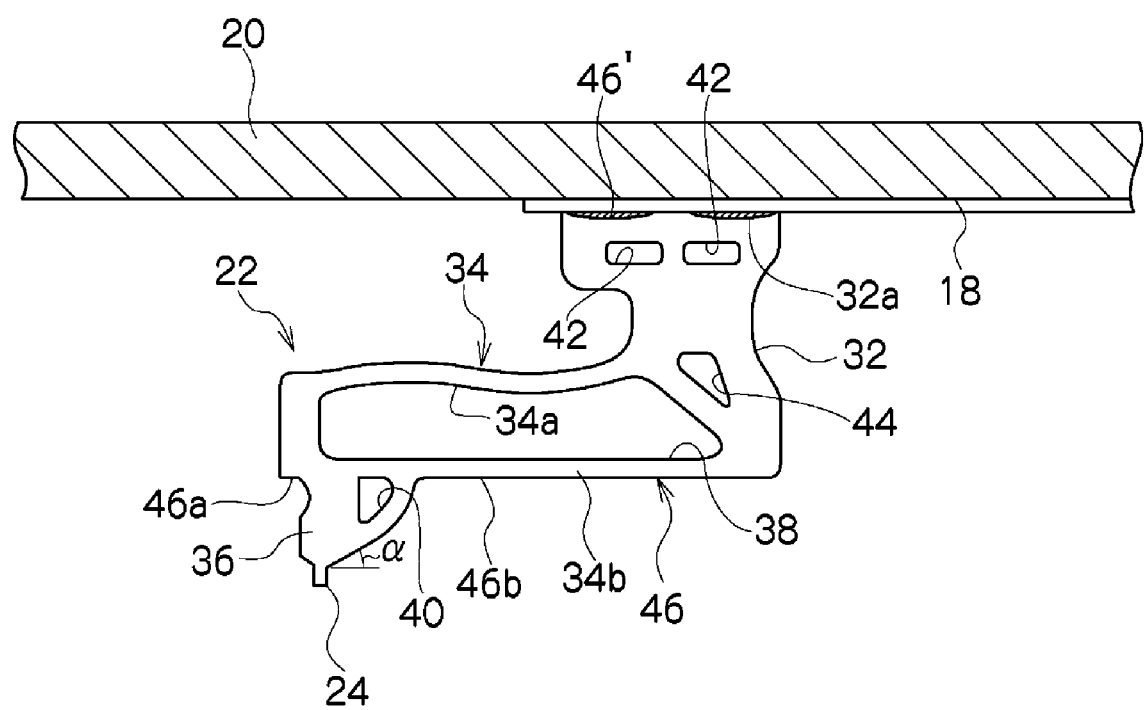
FIG. 3 is an enlarged front view of a probe of the electrical connecting apparatus according to the present invention.
Figure 4:
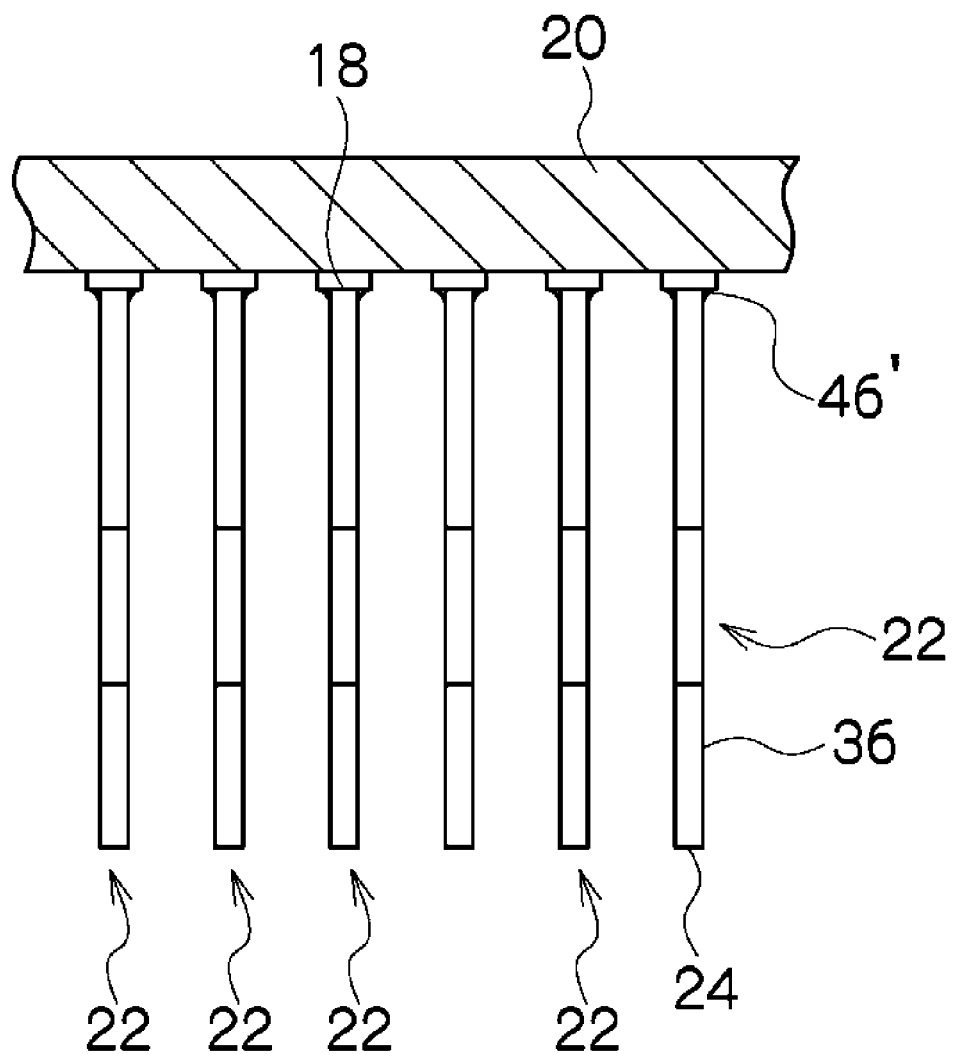
FIG. 4 is an enlarged side view of the probe of the electrical connecting apparatus according to the present invention.

The probe 22 on which the alignment mark used for the aforementioned positional adjustment of the electrical connecting apparatus 10 is provided is shown in FIGS. 3 and 4. The probe 22 is made of an entirely plate-shaped conductive member. The probe 22 comprises a base portion 32 whose one end is an attaching end 32a to the wiring path 18, an arm portion 34 connecting to the other end of the base portion and extending in the lateral direction, and a probe tip portion 36 integrally formed on the extending end portion of the arm portion, and on the tip end of the probe tip portion is formed the probe tip 24.

The portions 32, 34 and 36 excluding the probe tip 24 are preferably made of a highly resilient metal material such as nickel, nickel alloy or phosphor bronze. The probe tip 24 may be made of the same metal material as one for the other portions 32, 34 and 36. However, to enhance durability, it is preferable to form the probe tip 24 by a hard metal material such as cobalt, rhodium or alloy thereof and to embed this probe tip 24 in the protruded end of the probe tip portion 36.

Also, in the example shown in the figures, for easy flexible deformation of the arm portion 34, an elongated hole 38 that separates the arm portion 34 into upper and lower arm portions 34a and 34b extends in the longitudinal direction of the arm portion 34. This elongated hole 38 is formed penetrating the arm portion 34 in the plate thickness direction. Also, in the example shown in the figures, holes 40, 42, 44 respectively penetrating the probe tip portion 36 and the base portion 32 in the plate thickness directions are formed on the probe tip portion 36 and the base portion 32.

The hole 40 formed at the probe tip portion 36 acts to promote elastic deformation of the probe tip portion 36 along with the flexible deformation of the arm portion 34 when the probe tip 24 of the probe tip portion 36 is thrust against the electrode, as will be described later in detail. Also, as described later, after the probe 22 is formed by depositing its metal material on a not shown base table, the probe 22 is released from the base table by using etchant, and the holes 42 and 44 provided at the base portion 32 are ones to promote the etching effect of the etchant as the etchant goes into the gap between the base table and the probe 22. Thus, these holes 40, 42, 44 may be eliminated.

In the example shown in the figures, the attaching end 32a of the base portion 32 is formed in a waved shape to secure a gap that holds a soldering material 46' between the attaching end and the wiring path 18. Although the attaching end 32a may be a flat surface parallel to the wiring path 18, it is preferably a waved end surface as shown in the figure for firm coupling between the base portion 32 and the wiring path 18.

The arm portion 34 extends in the lateral direction from one side of the base portion 32 with a predetermined space from the attaching end 32a, that is, with a predetermined space from the probe board 20. In the example shown in the figures, the arm portion 34 is separated into the upper and lower arm portions 34a and 34b by the elongated hole 38 as described above, and these arm portions 34a, 34b are integrally coupled at their both ends.

Figure 5:
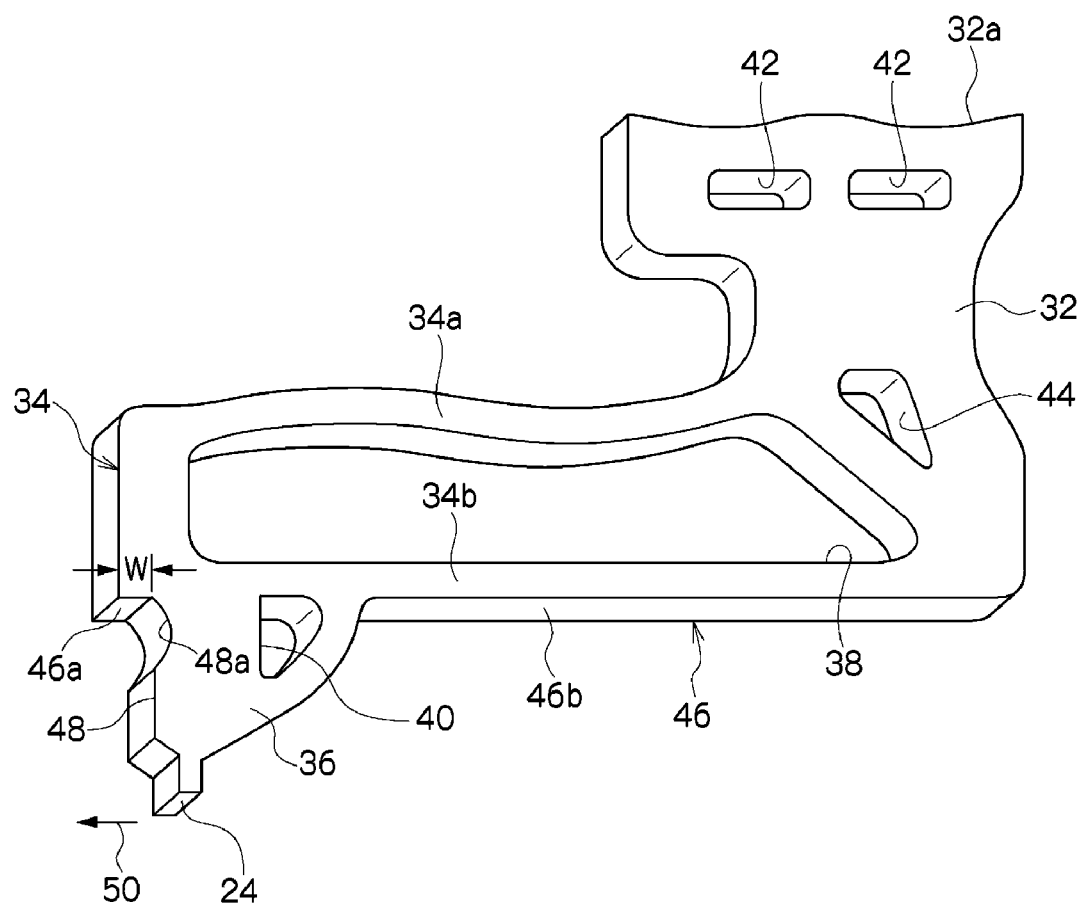
FIG. 5 is a perspective view of the probe according to the present invention.

A lower surface 46 of the lower arm portion 34b located on the side apart from the attaching end 32a of the base portion 32, out of the arm portions 34a, 34b, is formed of a flat surface approximately parallel to the horizontal plane along the probe board 20 and is in an elongated rectangular flat shape along the extending direction of the arm portion 34, as shown in FIGS. 4 and 5.

The probe tip portion 36 is formed to be protruded in the perpendicular direction from the lower surface 46 that is a flat surface area of the arm portion 34b with a width W left from the edge of the arm portion 34, as shown in FIG. 5. Accordingly, the lower surface 46 is separated by the probe tip portion 36 in the extending direction of the arm portion 34 into a lower surface portion 46a that is a first flat surface area portion corresponding to the width W and a lower surface portion 46b that is a second flat surface area portion constituted by the remaining portion. Thus, the protruded direction of the probe tip portion 36 and the protruded direction of the probe tip 24 correspond to the normal line direction of the lower surface 46 consisting of the first lower surface portion 46a and the second lower surface portion 46b.

Figure 6:
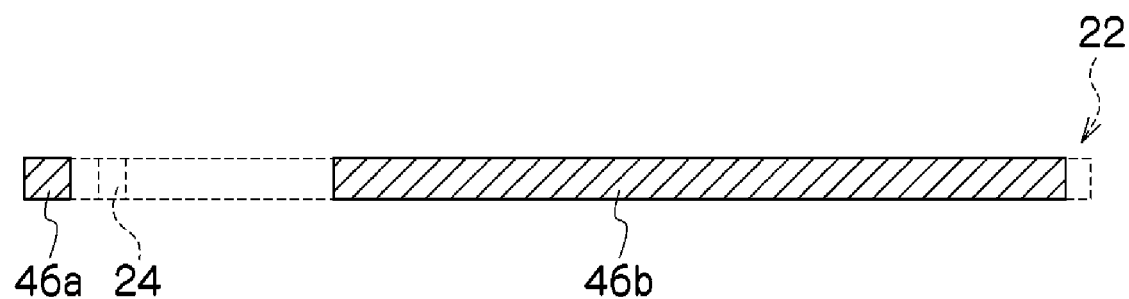
FIG. 6 shows an example of an alignment mark captured image of the probe according to the present invention.

FIG. 6 shows a captured image of the probe 22 captured by the capturing apparatus 30. In FIG. 6, the image portions corresponding to the first lower surface portion 46a, the probe tip 24 and the second lower surface portion 46b are indicated by the identical reference numbers, respectively, for descriptive purposes. The image portion corresponding to the lower surface portion 46a is shown as an approximately square image portion proximate to the image portion of the probe tip 24.

Referring to FIG. 5 again, on one side wall 48 of the probe tip portion 36 proximate to the lower surface portion 46a that is the first flat surface area portion and standing up from the lower surface portion is formed a curved surface portion 48a communicating with the lower surface portion 46a. By this curved surface portion 48a, a recess portion opened laterally is formed at the side wall 48.

When the probe tip 24 of the probe 22 contacts the corresponding electrode of the semiconductor wafer 12, and thereafter overdriving force is effected on the probe 22, arc-shaped elastic deformation that displaces the edge of the arm portion 34 upward occurs at the arm portions 34a, 34b of the probe 22. When the aforementioned arc-shaped elastic deformation occurs at the arm portion 34 by the overdriving force, the probe tip 24 slides on the electrode in an arrow direction indicated by a reference number 50.

This slide of the probe tip 24 breaks an oxide film on the electrode and ensures electrical connection between the probe tip 24 and the electrode. At this time, along with the slide of the probe tip 24, a compressive force is effected on the side wall 48 of the probe tip portion 36. The curved surface portion 48a formed on the side wall 48 is adapted to disperse this compressive force and prevent increase of stress caused by its partial concentration to enhance mechanical strength of the side wall 48 of the probe tip portion 36.

Also, as described above, the hole 40 of the probe tip portion 36 promotes elastic deformation of the probe tip portion 36 along with the slide of the probe tip 24 to make electrical connection between the probe tip 24 and the electrode more reliable.

In the electrical connecting apparatus 10 according to the present invention, the first lower surface portion 46a that is the first flat surface portion formed on the lower surface 46 of the arm portion 34 of the probe 22 is used as an alignment mark. Thus, as shown in FIG. 6, when the image portion corresponding to the lower surface portion 46a provided on a predetermined probe 22 of the probe board 20 is captured by the capturing apparatus 30, positional information of the lower surface portion 46a against the semiconductor wafer 12 on the XYZθ stage 14 is obtained from previously known positional information of the probe 22 on the probe board 20, as in the conventional case. Based on the positional information, a relative position between the electrical connecting apparatus 10 and the semiconductor wafer 12 is adjusted by driving of the XYZθ stage 14 so that each probe 22 of the electrical connecting apparatus 10 is appropriately connected to the corresponding electrode on the semiconductor wafer 12.

The lower surface portion 46a used as the alignment mark is formed to have a step from the probe tip 24 as high as the probe tip portion 36. Thus, even if the electrode of the semiconductor wafer 12 is scraped by the slide of the probe tip 24 as described above, the scraps can be surely prevented from attaching to the top of the lower surface portion 46a, and thus the aforementioned scraps will not appear in an image of the lower surface portion 46a.

As a result, the aforementioned scrap image will not be included in the outline of the alignment mark image (46a) obtained by the capturing apparatus 30, and a sharply-outlined alignment mark image (46a) can be obtained. Thus, it is possible to perform accurate alignment quickly.

The second lower surface portion 46b may be used as an alignment mark, and its captured image portion (46b) may be used as an alignment mark image. However, as shown in FIG. 6, since the first lower surface portion 46a is more proximate to the probe tip 24 than the second lower surface portion 46b, it is preferable to use the lower portion 46a as an alignment mark in order to improve positional accuracy of the probe tip 24 of each probe 22.

Also, as shown in FIG. 3, the side surface form of the probe tip portion 36 is preferably shaped so that a crossing angle α between any portion of the side surface of the probe tip portion 36 and the flat surface of the probe tip 24 exceeds 20 degrees, for example. By doing so, it is possible to surely prevent intense reflected light from a portion of the probe tip portion 36 excluding the probe tip 24 from being captured by the capturing apparatus 30. That is, by shaping the side surface form of the probe tip portion 36 so that the crossing angle α between the side surface of the probe tip portion 36 and the flat surface of the probe tip 24 may exceed 20 degrees, for example, the portion of the probe tip portion 36 excluding the probe tip 24 can be prevented from effecting as a reflection surface. Thus, the image portion of the probe tip portion 36 and the alignment mark image can be identified separately.

Probes 22 having the lower surface portion 46a may be used for all probes 22 provided on the probe board 20. However, it is preferable to arrange at least three probes 22 having the alignment mark 46a on the probe board 20 so that they may be spaced apart from one another. In such a case, for other probes 22, probes not having the aforementioned alignment mark 46a can be used in which, for example, the probe tip portion 36 stands up from the lower surface 46 without having the width W from the edge of the arm portion 34b. By doing so, the target probes 22 having the alignment mark 46a used for alignment can be distinguished easily from the other probes 22.

The aforementioned probe 22 can be formed as follows, for example. First, a recessed pattern formed in a flat surface shape of the probe 22 (a flat surface shape of the other portions 32, 34 and 36 excluding the probe tip 24 may also be available) is formed on the base table by a photoresist, using a photolithography technique used in the semiconductor manufacturing process. Next, metal materials for the probe 22 are deposited in its thickness direction sequentially in the recessed portion formed by this resist pattern by plating such as electroforming or deposition such as sputtering. Subsequently, the resist pattern is removed, the probe 22 is partially released from the base table by etching, and then the probe 22 is separated from the base table.

In this etching processing, since the etchant goes into the gap between the probe 22 and the base table through the holes 42, 44 provided on the base portion 32 of the probe 22, providing the holes 42, 44 can bring about effective etching processing for releasing the probe 22 from the base table, as described above. This etching promoting effect is given by the elongated hole 38 and the hole 40 as well.

Figure 7:
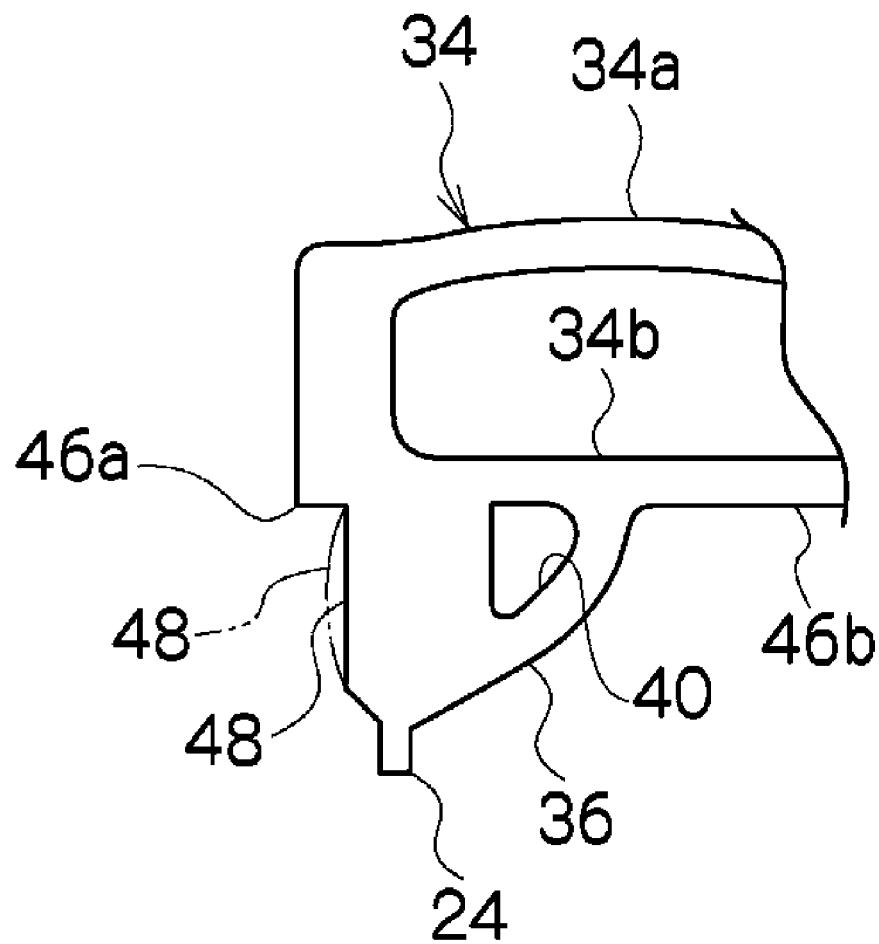
FIG. 7 is a partial front view showing another example of the probe according to the present invention.

The example shown in FIGS. 3 and 5 shows that the recessed curved surface portion 48a is formed on the side wall 48 of the probe tip portion 36. Alternatively, the side wall 48 may be an upright side wall perpendicular to the lower surface portion 46a as shown by a solid line in FIG. 7. Also, as shown by a virtual line in FIG. 7, the side wall 48 may be a raised curved surface side wall extending outward as far as the side wall does not substantially interfere with capturing of the lower surface portion 46a by the capturing apparatus 30.

INDUSTRIAL APPLICABILITY

The present invention is not limited to the above embodiment but may be altered in various ways without departing from the spirit and scope of the present invention.

EXPLANATION OF REFERENCE NUMERALS 10 electrical connecting apparatus
20 probe board
22 probe
24 probe tip
30 capturing apparatus
32 probe base portion
32a attaching end
34 arm portion
34a, 34b arm portion
36 probe tip portion
46 lower surface of arm portion
46a, 46b flat plane area portion
48 side wall
48a curved surface portion

What is claimed is:

1. A probe comprising a base portion having an attaching end, said base portion extending in a direction away from said attaching end, an arm portion extending from said base portion in a direction almost orthogonal to the extending direction of said base portion, a probe tip portion protruded from said arm portion and having a probe tip protruded from a protruding end of said probe tip portion, and an alignment mark for alignment of said probe tip of said probe tip portion, wherein:
    said arm portion has a flat surface area on the opposite side to a side where said attaching end of said base portion is located, said probe tip portion is formed to be protruded from a part of said flat surface area, and an alignment mark surface of said alignment mark is constituted by at least another part of said flat surface area;
    said flat surface area of said arm portion is a lower surface of said arm portion, and said lower surface is located on said arm portion on the opposite side of a side where said attaching end of said base portion is located and is formed in a rectangular flat surface shape extending along the extending direction of said arm portion;
    said probe tip portion is formed on said lower surface to separate said lower surface in the extending direction of said arm portion into one or more flat surface area parts, and said alignment mark is constituted by a first flat surface area part of the one or more flat surface area parts into which said lower surface is separated by said probe tip portion;
    said probe tip portion is formed to be spaced apart from an extending edge of said arm portion, and the first flat surface area part is located between said extending edge and said probe tip portion on said lower surface of said arm portion; and
    said probe tip portion has a side wall proximate to said first flat surface area part constituting said alignment mark and standing up from said first flat surface area part, and a portion of said side wall proximate to said first flat surface area part extends in a longitudinal direction along a recessed curved line opened toward said first flat surface area part.

2. The probe according to claim 1, wherein a normal line of the flat surface area constituting said alignment mark is directed to the same direction as the protruding direction of said probe tip of said probe tip portion.

3. The probe according to claim 1, wherein said alignment mark is configured to be captured by an image capturing means, and no reflective surface to said image capturing means is provided at said probe tip portion excluding said probe tip.

4. The probe according to claim 1, wherein said alignment mark is approximately a square.

5. The probe according to claim 1, wherein said arm portion has a pair of arm portions spaced apart from each other in the extending direction of said base portion and extending laterally, and a lower surface of a lower arm portion located on the side apart from said attaching end of said base portion, out of said pair of arm portions, forms said flat surface area.

6. The probe according to claim 1, the probe tip portion having a side surface, wherein the side surface and the flat surface area of the arm portion form a crossing angle that prevents reflected light from the side surface.

7. The probe according to claim 1, wherein the probe tip portion has a curved surface portion formed from a sidewall of the probe tip portion, the curved surface portion being configured to disperse compressive force effected on the probe tip portion.

8. The probe according to claim 1, wherein a distance from the flat surface area on which the alignment mark is formed to the probe tip corresponds to a sum of a height of the probe tip and a height of the probe tip portion on which the probe tip is formed.

* * * * *